United States Patent [19]

Sakamoto

[11] Patent Number: 5,336,922
[45] Date of Patent: Aug. 9, 1994

[54] DEVICE COMPRISING LOWER AND UPPER SILICON LAYERS AS CAPACITOR ELECTRODES AND METHOD OF MANUFACTURING SUCH DEVICES

[75] Inventor: Mitsuru Sakamoto, Tokyo, Japan

[73] Assignee: NEC Corporation, Tokyo, Japan

[21] Appl. No.: 738,426

[22] Filed: Jul. 31, 1991

[30] Foreign Application Priority Data

Jul. 31, 1990 [JP] Japan ................... 2-203314
Oct. 26, 1990 [JP] Japan ................... 2-288906

[51] Int. Cl.⁵ .................. H01L 29/68; H01L 29/78
[52] U.S. Cl. ..................... 257/534; 257/751; 257/306
[58] Field of Search ............... 357/23.6, 51; 257/534, 257/306, 310, 532, 751

[56] References Cited

U.S. PATENT DOCUMENTS 5,079,670  1/1992  Tigelaar .................. 361/313

FOREIGN PATENT DOCUMENTS 60-106163  11/1985  Japan ................... 357/51
62-259465  11/1987  Japan ................... 357/23.6
1-94645    4/1989   Japan ................... 257/534
1-225147   9/1989   Japan ................... 257/534
1-255262   10/1989  Japan ................... 357/23.6

OTHER PUBLICATIONS

IBM Tech. Disclosure Bulletin, "Self-Aligned Polycide Bit Line Structure" vol. 30 No. 12 May 1988 pp. 109–110.
"Novel Stacked Capacitor Cell for 64Mb DRAM", W. Wakamiya, et al., VLSI Symp., 1989, pp. 69 to 70.
"A 5-V Only 16-kbit Stacked-Capacitor MOS RAM", IEEE Transactions on Electron Devices, vol. ED-27, No. 8, Aug. 1980, pp. 1596–1601, by M. Koyanagi, et al.
"3-Dimensional Stacked Capacitor Cell for 16M and 64M Drams", IEDM Tech. Dig., 1988 pp. 592–595, T. Ema, et al.

Primary Examiner—Jerome Jackson
Assistant Examiner—D. Monin
Attorney, Agent, or Firm—Burns, Doane, Swecker & Mathis

[57] ABSTRACT

In a semiconductor device including charge storage capacitors, each of which includes a patterned electrode having electrode side and top surfaces, a dielectric film on the side and top surfaces, and a covering electrode on the dielectric film, the patterned electrode is composed of a lower silicon layer having layer side and top surfaces and an upper silicon layer lying on the layer side and top surfaces and having the electrode side and top surfaces. The dielectric film may be in direct contact with the electrode side and top surfaces. In this event, the lower silicon layer is preferably doped to a lower concentration between $10^{15}$ and $10^{18}$ atoms per cubic centimeter and the upper silicon layer, to a higher concentration between $10^{18}$ and $10^{20}$ atoms per cubic centimeter. Alternatively, a barrier metal film may be interposed between the dielectric film and the electrode side and top surfaces. In this event, each of the lower and the upper silicon layers is preferably doped to the lower concentration. More preferably, an amorphous silicon film is preliminarily deposited on the micro-rough side and top surfaces of an underlying silicon layer to provide the upper silicon layer having smooth electrode side and top surfaces.

2 Claims, 12 Drawing Sheets

DEVICE COMPRISING LOWER AND UPPER SILICON LAYERS AS CAPACITOR ELECTRODES AND METHOD OF MANUFACTURING SUCH DEVICES

BACKGROUND OF THE INVENTION

This invention relates to a semiconductor device comprising charge storage capacitor cells and to a method of manufacturing the semiconductor device or a like semiconductor device.

At present, on the market are very large scale integrated circuits (VLSI's) of a design rule of 0.8 micron, such as four-megabit dynamic random access memories (DRAM's) and one-megabit static random access memories (SRAM's). Research and development are in progress in connection with ultra large scale integrated circuits (ULSI's) of a closer design rule of 0.5 to 0.6 micron, such as sixteen-megabit dynamic random access memories and four-megabit static random access memories. Studies are carried on as regards practical use of such ultra large scale integrated circuits.

On giving a high package density, a large memory capacity, and a large capacitance to, for example, a dynamic random access memory, it is necessary to stack the charge storage capacitor cells three-dimensionally. For use as the capacitor cells of either the above-mentioned sixteen-megabit dynamic random access memories or 64-megabit dynamic random access memories of a stricter design rule, a fin structure is proposed by T. Ema and eight others to the IEDM Tech. Dig., 1988, pages 592 to 595. Furthermore, a cylindrical structure is proposed by W. Wakayama and four others in the VLSI Symp., 1989, pages 69 to 70.

On commercially manufacturing a semiconductor device comprising the capacitor cells, the fin and the cylindrical structures have not been used because of the following problems. One is the fact that it is very difficult to uniformly form a capacitor dielectric film on electrode side and top surfaces of a patterned electrode of each capacitor cell and to similarly uniformly form a covering or counter electrode on the dielectric film. This is because the patterned electrode has a complicated structure. Another problem is the fact that it is also difficult to render an interlayer insulator layer flat enough for subsequent wiring. This is because the patterned electrode has a pattern of a great aspect ratio.

In the manner which will later be described more in detail, a conventional semiconductor device is manufactured as follows to comprise charge storage capacitor cells. An insulator film for cell separation is first formed on a substrate surface of a semiconductor substrate. Openings or holes are selectively formed through the insulator film. In order to form the capacitor cells on the insulator film, heavily doped patternd electrodes of the respective capacitor cells are patterned on the insulator film to fill the respective openings and to leave an exposed insulator area around the patterned electrodes. Each patterned electrode has electrode side and top surfaces. A dielectric film is deposited on the electrode side and top surfaces of each patterned electrode and on the exposed insulator area. A heavily doped covering or counter electrode is grown on the dielectric film over each patterned electrode. An interlayer insulator layer is formed on the covering electrodes to have a flat layer surface. Wirings are finally formed on the flat layer surface of the interlayer insulator layer.

The following problems have become clear on making such a semiconductor device have a small size, a high package density, and a large capacitance. When each opening is made to have a small diameter, the openings become to have a great aspect ratio. This renders it difficult to make the patterned electrodes fill the openings if the patterned electrodes are doped with an impurity. When the dielectric film is given a thin film thickness, each patterned electrode is subjected to reversal at an interface contiguous to the dielectric film. This reduces the capacitance. Reduction in the capacitance can be avoided if the patterned electrodes were heavily doped. A compromise is therefore necessary between complete filling of the openings and an increase in the capacitance. If a desired capacitance should be insured with the high package density attained, the patterned electrodes must have a wide total surface area per unit area of the substrate surface. It has, however, been difficult to reduce a distance between one of the capacitor cells and another capacitor cell or a different element of the integrated circuit.

On the other hand, it is an important problem to raise quality, such as an insulating capability, and reliability of the insulator film and/or the dielectric film. In this connection, it has been confirmed that the substrate surface has a micro-roughness or, more particularly, undulations of the order of 10 Å and that this roughness adversely affects the insulating capability and the reliability of the insulator film particularly when the insulator film is as thin as 100 Å. It has furthermore been confirmed that the electrode side and top surfaces are rough surfaces having undulations of the order of 1000 Å and that such a rough surface adversely affects the insulating capability and the reliability of the dielectric film particularly when the dielectric film is as thin as 50 Å.

SUMMARY OF THE INVENTION

It is therefore a principal object of the present invention to provide a semiconductor device which comprises charge storage capacitor cells and has a high package density with a desired capacitance insured.

It is another principal object of this invention to provide a semiconductor device which is of the type described, which comprises an insulator film having openings below the respective capacitor cells, and in which the openings can have a great aspect ratio.

It is still another principal object of this invention to provide a semiconductor device which is of the type described and which is for use as a dynamic random access memory or a static random access memory.

It is a further principal object of this invention to provide a method of manufacturing a semiconductor device of the type described.

It is an object of this invention to provide a semiconductor device which is of the type described and which has a high reliability.

It is another object of this invention to provide a method of manufacturing a semiconductor device which comprises an insulator film on a substrate surface of a semiconductor substrate and in which the insulator film has an excellent insulating capability and a high reliability.

It is still another object of this invention to provide a method of manufacturing a semiconductor device which comprises a dielectric film in each charge storage capacitor cell and in which the dielectric film has an excellent insulating capability and a high reliability.

Other objects of this invention will become clear as the description proceeds.

On describing an aspect of this invention, it is possible to understand that a semiconductor device comprises a semiconductor substrate having a substrate surface, an insulator film on the substrate surface, and a charge storage capacitor comprising a patterned electrode patterned on the insulator film and having electrode side and top surfaces, a dielectric film on the electrode side and top surfaces, and a covering electrode on the dielectric film.

According to the above-mentioned aspect of this invention, the patterned electrode of the above-understood semiconductor device is composed of a lower silicon layer patterned on the insulator film and having layer side and top surfaces and an upper silicon layer having the electrode side and top surfaces and being in electric contact with the layer side and top surfaces.

On describing a different aspect of this invention, it is possible to understand that a method of manufacturing a semiconductor device comprises the steps of forming an insulator film on a substrate surface of a semiconductor substrate, selectively forming openings through the insulator film, patterning patterned electrodes on the insulator film with the patterned electrodes made to fill the openings, respectively, And forming charge storage capacitors by using the patterned electrodes, respectively.

According to a different aspect of this invention, the patterning step of the above-understood method comprises the steps of patterning lower silicon layers on the insulator film with the lower silicon layers made to fill the openings, respectively, and with each of the lower silicon layers made to have layer side and top surfaces, and growing upper silicon layers by selectively growing polysilicon on the layer side and top surfaces of the lower silicon layers.

According to another different aspect of this invention, there is provided a method of manufacturing a semiconductor device comprising an underlying substrate having a micro-rough surface, wherein the method comprises the steps of depositing a silicon film on the micro-rough surface to provide a semiconductor substrate having a smooth surface and forming an insulator film on the smooth surface.

BRIEF DESCRIPTION OF THE DRAWING

FIGS. 5 (A) to (H) show, in schematic vertical sections and in successive steps of manufacture, a semiconductor device according to a second embodiment of this invention;

FIGS. 6 (A) to (H) show, in schematic vertical sections and in successive steps of manufacture, a semiconductor device according to a third embodiment of this invention;

FIGS. 9 (A) and (B) show, in schematic vertical sections, a semiconductor device which is mentioned in conjunction with FIG. 7 and is in the process of being manufactured;

FIGS. 10 (A) to (F) show, in schematic vertical sections and in successive steps of manufacture, a semiconductor device according to a fifth embodiment of this invention;

FIGS. 12 (A) to (C) show, in schematic vertical sections and in successive steps of manufacture, a semiconductor device according to a sixth embodiment of this invention.

DESCRIPTION OF THE PREFERRED EMBODIMENTS

Figure 1:
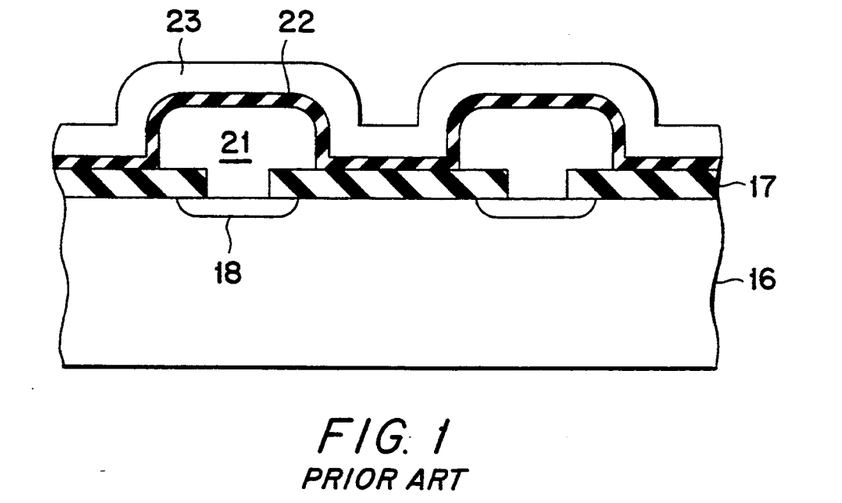
FIG. 1 is a schematic vertical sectional view of a conventional semiconductor device.

Referring to FIG. 1, a conventional semiconductor device will be described at first in order to facilitate an understanding of the present invention. The semiconductor device is what was disclosed in an article contributed by M. Koyanagi and four others to the IEEE Transactions on Electron Devices, Volume ED-27, No. 8 (August 1980), pages 1596 to 1601, under the title of "A 5-V only 16-kbit Stacked Capacitor MOS RAM". The semiconductor device comprises charge storage capacitor cells in the manner which will become clear as the description proceeds. In the manner described in detail in the above-mentioned Koyanagi et al. article, the semiconductor device is manufactured as follows.

It should be noted throughout the drawing figures that semiconductor parts of each semiconductor device are not hatched although depicted in schematic vertical sections. Furthermore, it should be noted throughout the instant specification that materials including impurities, two-dimensional sizes of parts, film and layer thicknesses, working processes together with time durations and temperatures, and the like are not different, unless otherwise specifically mentioned, from those used in conventional methods of manufacturing like semiconductor devices.

A silicon substrate 16 is p-type doped and has a substrate surface upwardly of the figure. As an insulator film 17 for use in separating the capacitor cells, a silicon dioxide film is formed on the substrate surface by local oxidization to an appreciable film thickness. Openings or holes are selectively formed through the insulator film 17 to expose exposed substrate areas of the substrate surface. An n-type impurity, such as phosphorus or arsenic, is ion implanted into the silicon substrate 16 through the respective openings to form n+-type diffusion regions 18.

For use as patterned electrodes 21 of the respective capacitor cells, patterned silicon layers are formed in a predetermined pattern of filling the respective openings, lying on the insulator film 17, and leaving an exposed insulator area which the insulator film 17 has around the patterned electrodes 21. In the patterned electrodes 21, polysilicon is heavily doped with an n-type impurity, such as phosphorus or arsenic, to a very high concentration of $10^{20}$ atoms per cubic centimeter. Each patterned electrode 21 has electrode side and top surfaces.

So as to serve as a dielectric film 22, a dielectric material, such as silicon dioxide, is deposited by a chemical vapor deposition (CVD) method on the electrode side and top surfaces of the patterned electrodes 21 and on the exposed insulator area. Thereafter, a covering or counter electrode 23 is formed on the dielectric film 22 by deposition of polysilicon doped with an n-type impurity which may or may not be identical with the impurity used in the patterned electrodes 21.

Combinations of the patterned electrodes 21, the dielectric film 22, and the covering electrode 23 serve as the capacitor cells. In the manner described heretobefore, it is difficult to make the capacitor cells have a small size, a high package density, and a large capacitance.

Figure 2:
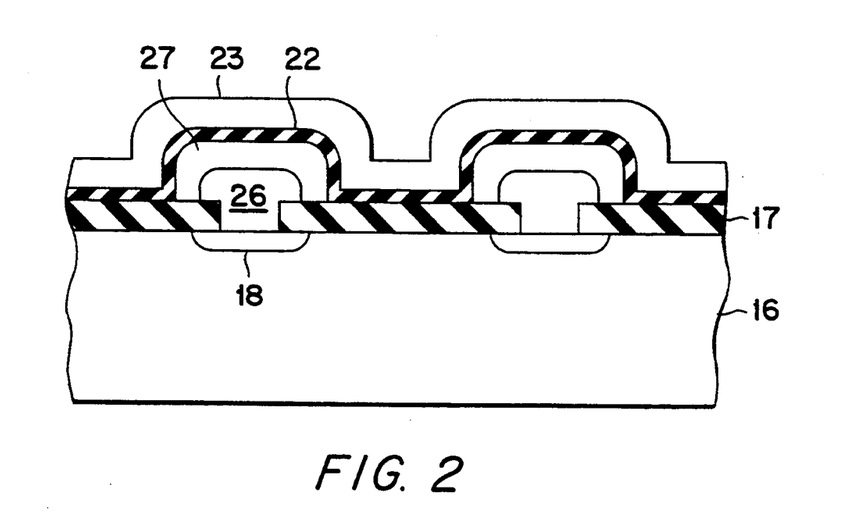
FIG. 2 is a schematic vertical sectional view of a semiconductor device according to a first embodiment of the instant invention.
Figure 3:
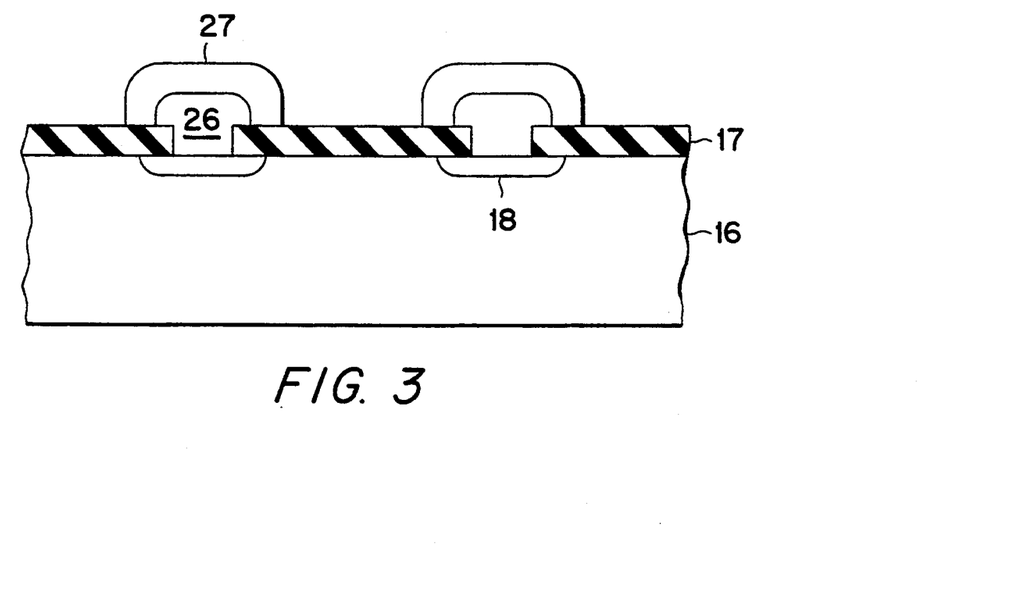
FIG. 3 is a schematic vertical sectional view of the semiconductor device illustrated in FIG. 2 and is in the process of being manufactured.
Figure 4:
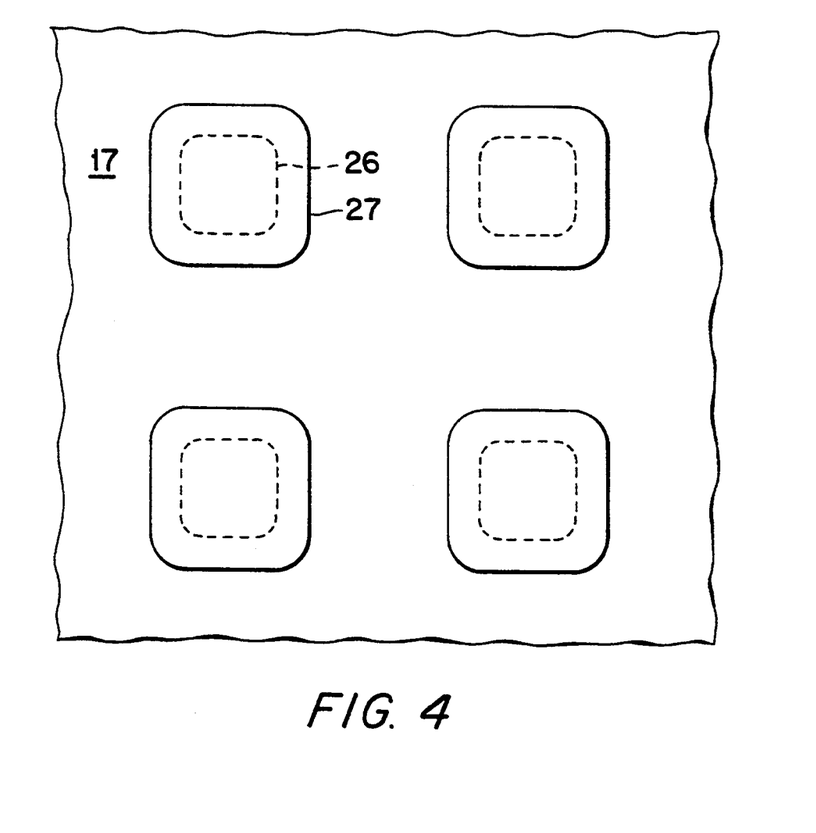
FIG. 4 is a schematic top view of the semiconductor device depicted in FIG. 3.

Referring now to FIGS. 2 through 4, the description will proceed to a semiconductor device according to a first embodiment of this invention. Similar parts are designated by like reference numerals.

The semiconductor device is manufactured in a manner which is similar to that illustrated with reference to FIG. 1. It should, however, be noted that the patterned electrodes 21 (FIG. 1) are manufactured in two steps.

At first, lower silicon layers 26 are formed on the insulator film 17 to a film thickness between 1000 and 5000 Å and in a predetermined pattern of filling the respective openings, lying on the insulator film 17, and leaving a wider exposed insulator area around the lower silicon layers 26 by resorting to selective epitaxial growth of polysilicon doped with an n-type impurity to a lower concentration between $10^{15}$ and $10^{18}$ atoms per cubic centimeter. This lower concentration enables the lower silicon layers 26 to readily and excellently fill the openings. As a result, it is possible to make the predetermined pattern to have a great aspect ratio which is typically equal to five.

During the selective epitaxial growth, the exposed substrate areas serve as nuclei of growth of polysilicon. Instead of the selective epitaxial growth, it is possible to resort to polysilicon growth followed by patterning according to the known micro-working technique. Alternatively, amorphous silicon growth may be followed by heat treatment and the patterning. Each lower silicon layer 26 has layer side and top surfaces.

Subsequently, upper silicon layers 27 are selectively deposited only on the layer side and top surfaces of the lower silicon layers 26 to the above-exemplified film thickness by resorting to chemical vapor deposition of polysilicon doped with an n-type impurity to a higher concentration between $10^{18}$ and $10^{20}$ atoms per cubic centimeter. Being grown directly on the layer side and top surfaces of the lower silicon layers 26, the upper silicon layers 27 are in electric contact with the respective lower silicon layers 26. A narrower exposed insulator area is left on the insulator film 17 around the upper silicon layers 27. Each upper silicon layer 27 has the above-mentioned electrode side and top surfaces.

As a result of the selective deposition of the upper silicon layers 27, it is possible to closely arrange the lower silicon layers 26 on the insulator film 17. This makes it possible to attain a high package density and enables the electrode side and top surfaces of the upper silicon layers 27 to have a total surface area which is about fifty percent wider than a similar surface area of a conventional semiconductor device.

The dielectric film 22 is thereafter formed to cover the upper silicon layers 27 and the narrower exposed insulator area by subjecting tantalum oxide either to plasma chemical vapor deposition or to sputtering. When such a tantalum oxide film is used, it is possible to render the dielectric film 22 as thin as 100 Å or less. This thin film thickness is astonishingly thin when compared with a silicon dioxide film because tantalum oxide has a high relative permittivity. The tantalum oxide film is equivalent to a silicon dioxide film of a very thin film thickness of about 20 to 30Å. Alternatively, it is possible to form the dielectric film 17 by chemical vapor deposition of silicon nitride. In this event, the silicon nitride film is subjected to thermal oxdization to change its surface portion into an oxide in the manner described in the afore-cited Koyanagi et al. article. Either such a silicon nitride film or a silicon oxynitride film may have a film thickness which is equivalent to an about 50-Å thick silicon dioxide film.

In connection with the above, it is possible to understand that a dielectric film 22 is separately deposited on the electrode side and top surfaces of each upper silicon layer 27. This applies to like dielectric films used in other semiconductor devices according to this invention.

The covering electrode 23 is formed by resorting either to chemical vapor deposition or to sputtering of either doped polysilicon or a metallic material, such as tungsten or molybdenum. Inasmuch as the higher concentration of impurity is used in the upper silicon layers 27 to prevent the afore-mentioned reversal from taking place at an interface between each upper silicon layer 27 and the dielectric film 22, it is possible to give a very thin film thickness to the dielectric film 22 and thereby to make the capacitor cells have a great capacitance.

Referring to FIGS. 5 (A) through (H), the description will proceed to a semiconductor device according to a second embodiment of this invention. The semiconductor device is operable as a dynamic random access memory and comprises similar parts designated by like reference numerals. The dynamic random access memory is manufactured as follows.

In FIG. 5 (A), a channel stopper region 31 is selectively formed on the substrate surface of a silicon substrate 16. A silicon dioxide film 32 is formed on the channel stopper region 31.

In FIG. 5 (B), gate oxide films 33 are selectively formed on the substrate surface. On the silicon dioxide film 32 and on the gate oxide film 33, gate electrodes 34 are selectively formed of one of polysilicon, silicide, and a like material that is doped with phosphorus. Each gate electrode 34 has gate side and top surfaces. A wider exposed substrate area is left on the substrate surface around the gate electrodes 34.

Figure 5A:
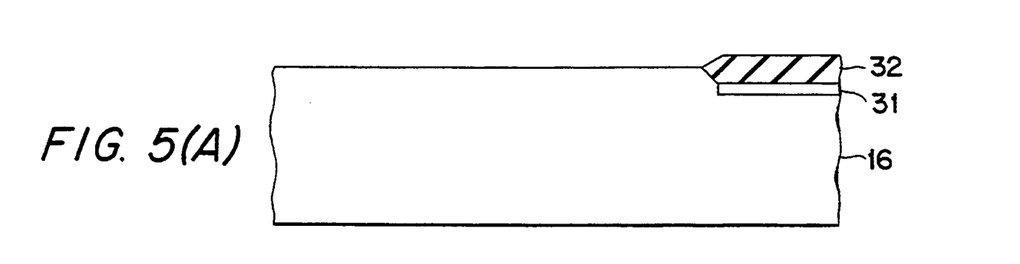
Figure 5B:
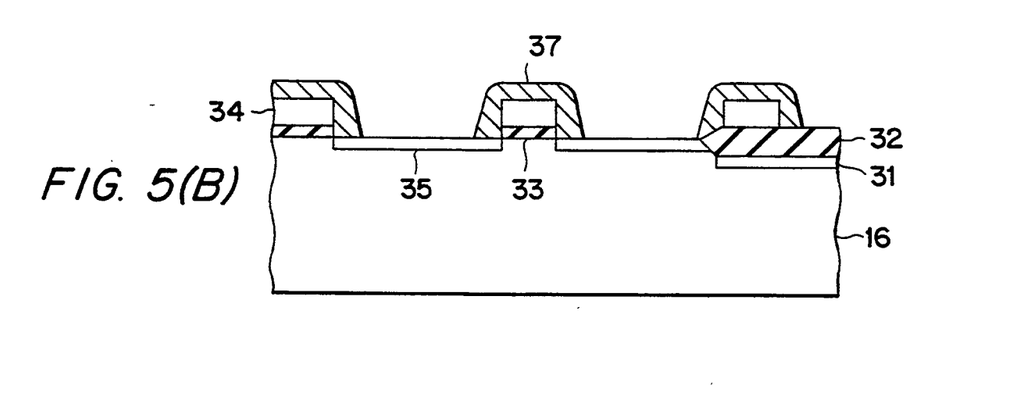
Figure 5C:
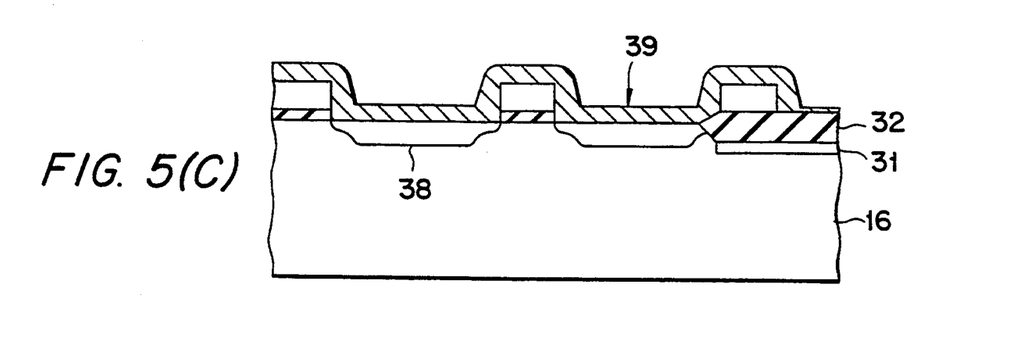
Figure 5D:
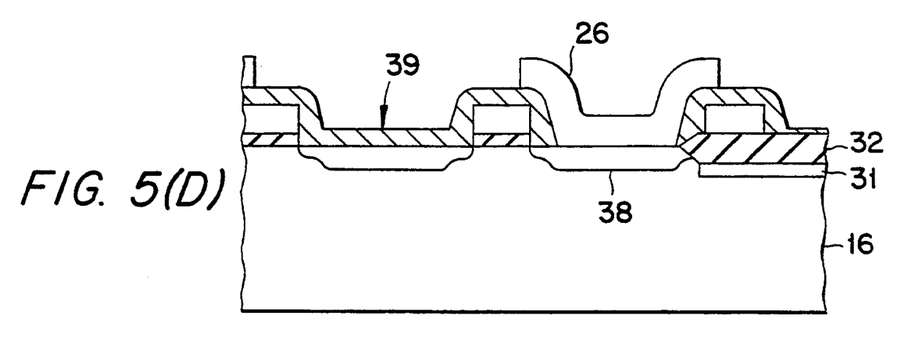
Figure 5E:
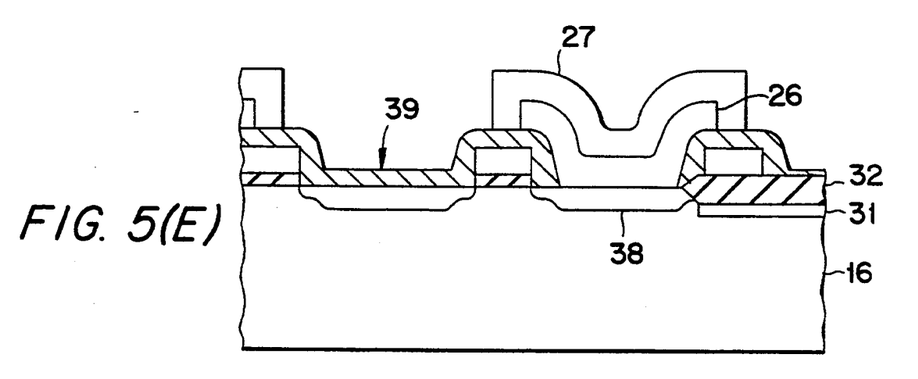
Figure 5F:
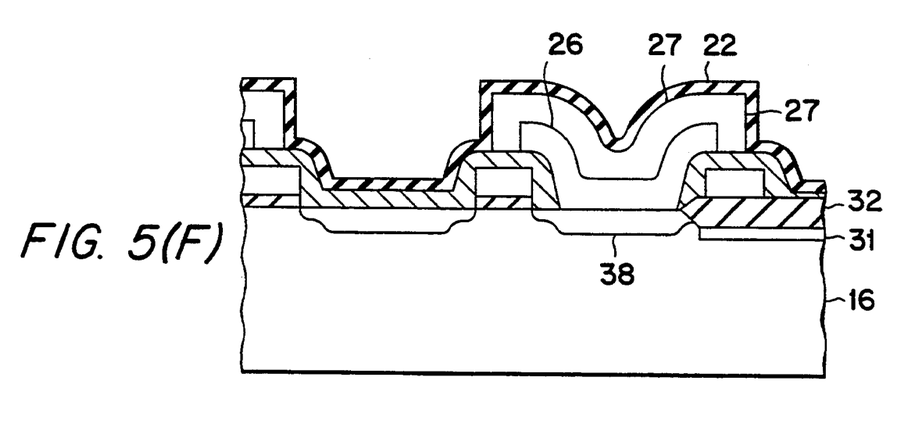
Figure 5G:
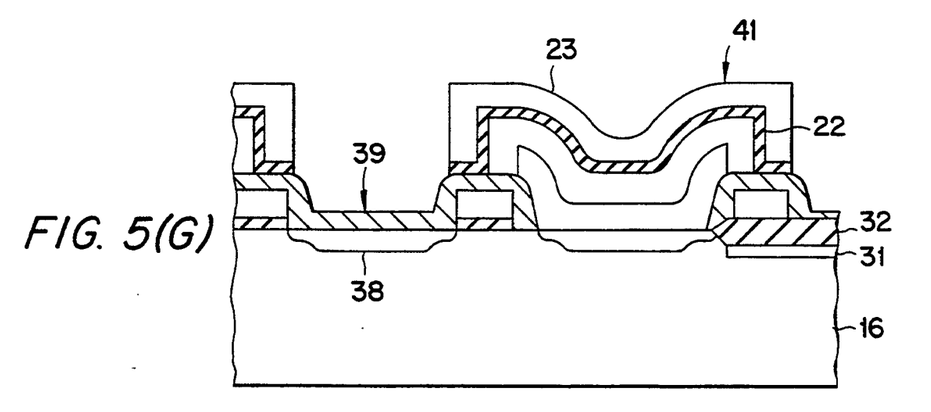
Figure 5H:
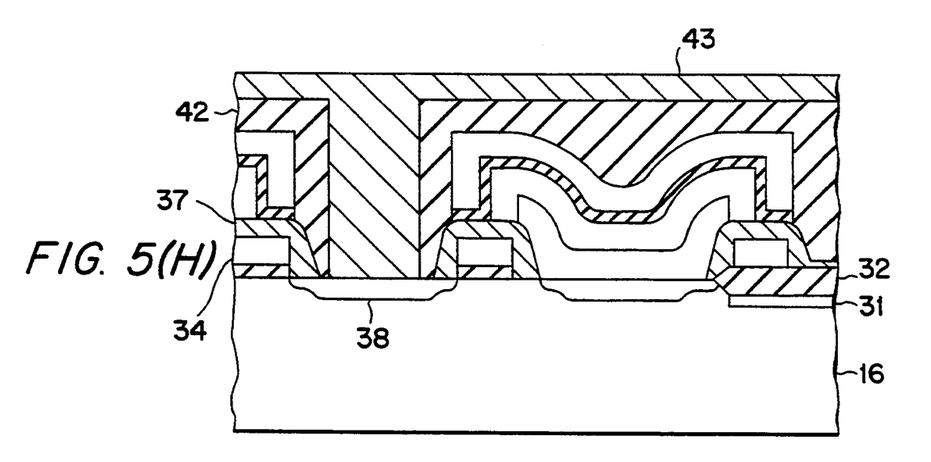
Figure 6A:
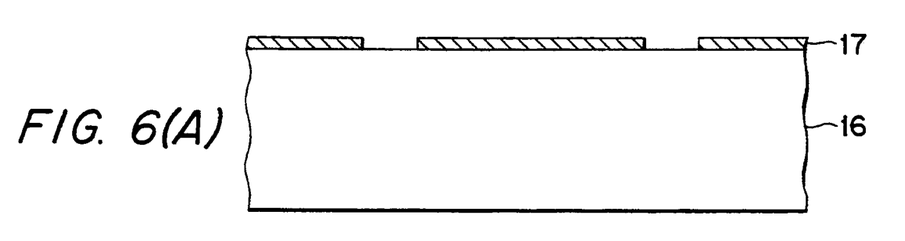
Figure 6B:
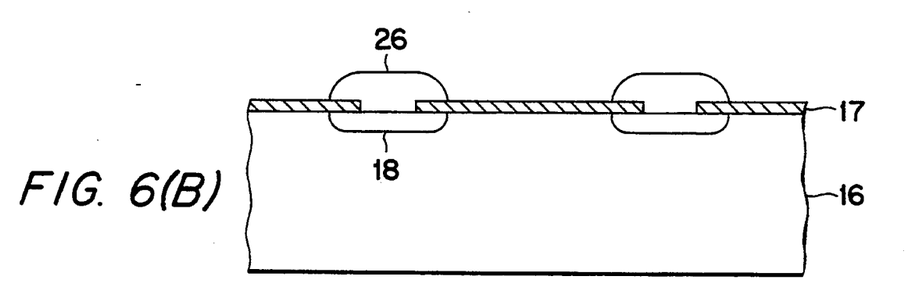
Figure 6C:
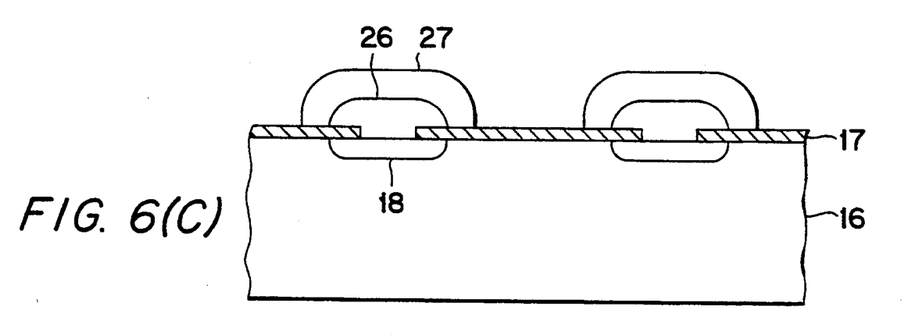
Figure 6D:
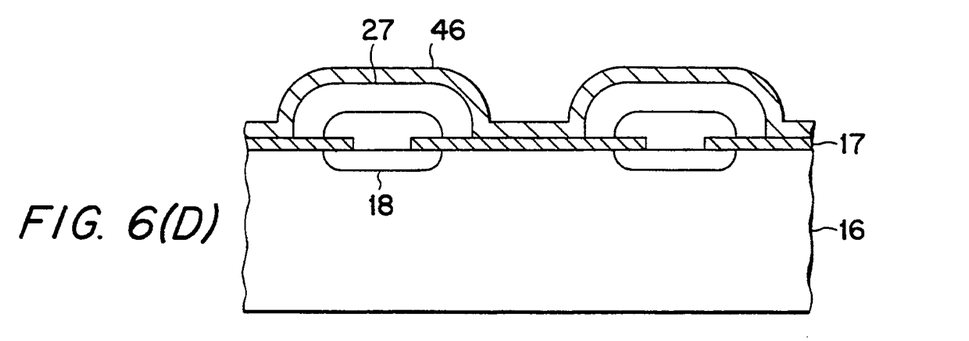
Figure 6E:
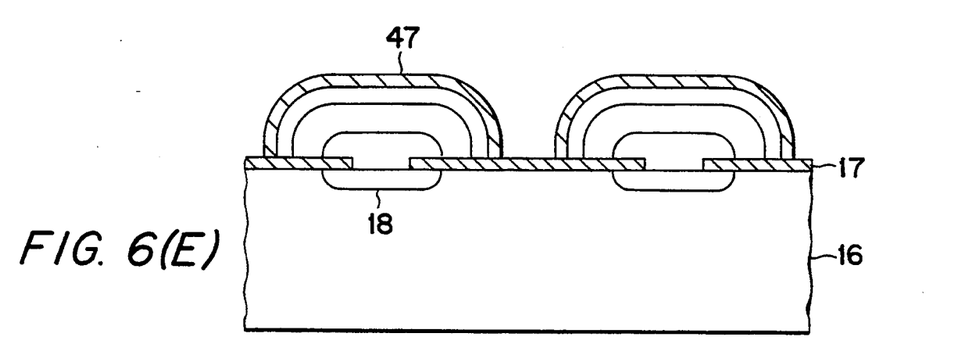
Figure 6F:
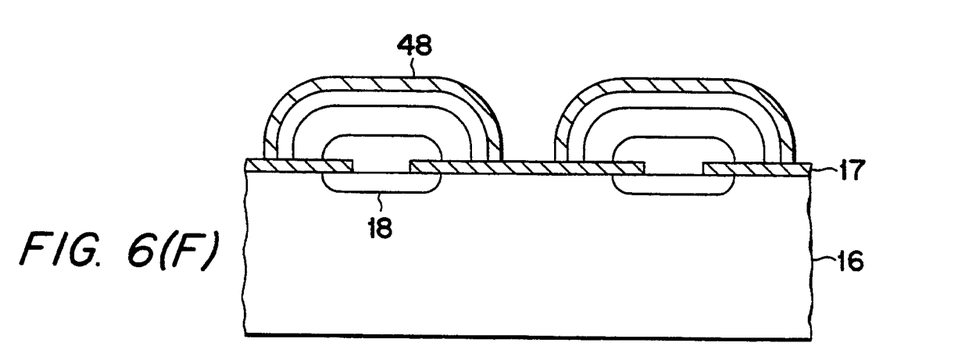
Figure 6G:
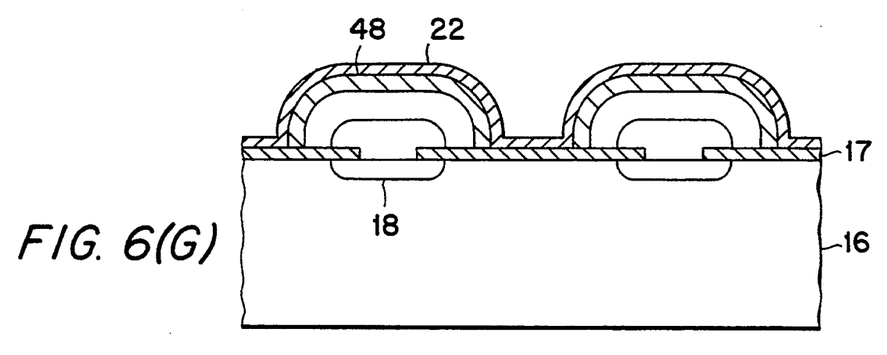
Figure 6H:
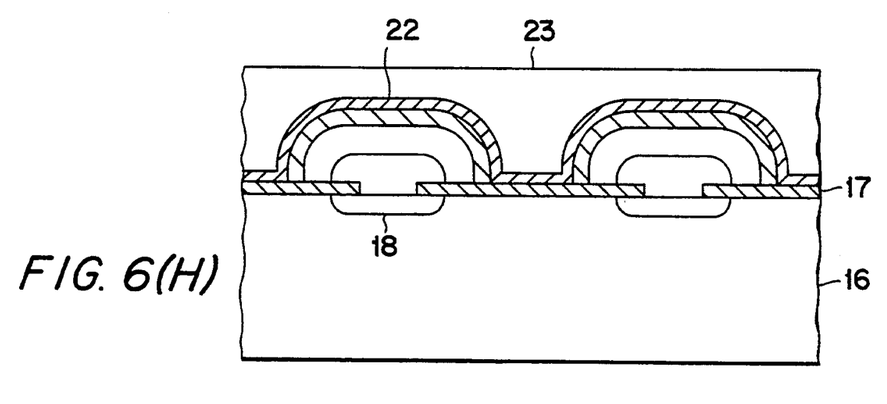

By using the silicon dioxide film 32 and the gate electrodes 34 collectively as a mask, an n-type impurity, such as phosphorus, is ion implanted into the silicon substrate 16 to form relatively shallow diffusion regions 35. Spacer layers 37 are formed of silicon dioxide on the gate side and top surfaces of the gate electrodes 34 to leave a narrower exposed substrate area on the substrate surface around the spacer layers 37.

In FIG. 5 (C), the spacer layers 37 are used collectively as a mask for ion implantation of an n-type impurity, as phosphorus or arsenic, into the silicon substrate 16. Subsequently, heat treatment is carried out to form n-type relatively deep diffusion regions 38. As a result of the heat treatment, the narrower exposed substrate area is oxidized into silicon dioxide to form a continuous spacer 39 including the spacer layers 37.

In FIG. 5 (D), openings or holes are selectively formed through the continuous spacer 39 to expose exposed region areas of the relatively deep diffusion regions 38. The lower silicon layers 26 are formed in a predetermined pattern of filling the respective openings and of lying on the continuous spacer 39. For use as the lower silicon layers 26, polysilicon may include phosphorus to a relatively low concentration selected in the lower concentration.

In FIG. 5 (E), the upper silicon layers 27 are selectively deposited only on the layer side and top surfaces of the lower silicon layers 26 by chemical vapor deposition of polysilicon doped with phosphorus to the above-mentioned higher concentration. The continuous spacer 39 has a wider exposed spacer area around the upper silicon layers 27.

In FIG. 5 (F), the dielectric film 22 is formed on the electrode side and top surfaces of the upper silicon layers 27 and on the wider exposed spacer area. Preferably, the dielectric film 22 is the above-mentioned silicon nitride film with its surface subjected to thermal oxidization or silicon nitride and is 50 Å thick.

In FIG. 5 (G), the covering electrode 23 (FIG. 2) is formed on the dielectric film 22. Together with the dielectric film 22, the covering electrode 23 is patterned into discrete electrodes 41. A narrower exposed spacer area is left around the discrete electrodes 41.

In FIG. 5 (H), an interlayer insulator layer 42 is formed on the discrete electrodes 41 and on the narrower exposed spacer area to have a flat layer surface. Openings are selectively formed through the interlayer insulator layer 42 to reach the relatively deep diffusion regions 38. Wirings 43 are formed on the flat layer surface in a predetermined pattern and to fill the openings and to reach the relatively deep diffusion regions 38.

Referring to FIGS. 6 (A) through (H), the description will proceed to a semiconductor device according to a third embodiment of this invention. The semiconductor device is similar in structure to that illustrated with reference to FIGS. 2 through 4 and comprises similar parts designated by like reference numerals. The semiconductor device is manufactured as follows.

In FIG. 6 (A), the insulator film 17 is formed for separation of the capacitor cells on the substrate surface of a silicon substrate 16 by selective oxidization of the substrate surface. Openings or holes are selectively formed through the insulator film 17 to expose the exposed substrate areas.

In FIG. 6 (B), an n-type impurity, such as arsenic, is ion implanted through the openings into the silicon substrate 16 to form the n+-type diffusion regions 18 by subsequent heat treatment. Using the selective epitaxial growth described in conjunction with FIGS. 3 and 4, the lower silicon layers 26 are formed in a predetermined pattern of filling the respective openings, lying on the insulator film 17, and leaving the wider exposed insulator area. The lower silicon layers 26 are preferably made of polysilicon including an n-type impurity, such as arsenic or phosphorus, to the lower concentration.

In FIG. 6 (C), the upper silicon layers 27 are selectively deposited by the chemical vapor deposition method only on the layer side and top surfaces of the lower silicon layers 26. A narrower exposed insulator area is left on the insulator film 17 around the upper silicon layers 27. The upper silicon layers 27 are made of polysilicon including an n-type impurity which may or may not be identical with that used in the lower silicon layers 26. It should clearly be noted in this connection that polysilicon is used in the upper silicon layers 27 of the example being illustrated to include the n-type impurity of the lower concentration or, more specifically, of a concentration which is substantially equal to the lower concentration used in the lower silicon layers 26.

In FIG. 6 (D), a titanium metal film 46 is deposited by sputtering on the electrode side and top surfaces of the upper silicon layers 27 and the narrower exposed insulator area to a film thickness between 500 and 1000 Å. Subsequently, the titanium metal film 46 is heat treated. The titanium metal film 46 is thereby changed to a titanium silicide film (not shown) at a portion adjacent to an interface contiguous to the upper silicon layers 27 as a result of chemical reaction with polysilicon. This provides an assembly of the silicon substrate 16 with the diffusion regions 18, the insulator film 17, the lower and the upper silicon layers 26 and 27, and the titanium metal film 46 including the titanium silicide film.

In FIG. 6 (E), the assembly is dipped in an agent consisting essentially of ammonium, hydrogen peroxide, and water. Titanium metal is thereby removed from the narrower exposed insluator area and the titanium silicide film to leave discrite titanium silicide films 47 only on the electrode side and top surfaces of the upper silicon layers 27.

In FIG. 6 (F), the titanium silicide films 47 are heat treated in an ammonia atmosphere. This changes the titanium silicide films 47 into titanium nitride films which serve as barrier metal films 48. It is possible to form such barrier metal films 48 by using a metal having a high melting point, such as tungsten. A somewhat wider insulator area is left around the barrier metal films 48 covering the respective upper silicon layers 27.

In FIG. 6 (G), the dielectric film 22 is deposited on the barrier metal films 48 and the somewhat wider insulator area. Preferably, the dielectric film 22 is made of tantalum oxide to the above-exemplified film thickness of 100 Å.

In FIG. 6 (H), the covering electrode 23 is formed on the dielectric film 22 either by bias sputtering or chemical vapor deposition of tungsten. This completes the semiconductor device under consideration.

Reviewing FIGS. 6 (A) to (H), the semiconductor device additionally comprises the barrier metal films 48. This avoids direct contact of the dielectric film 22 with the upper silicon layers 27 to prevent a chemical reaction from taking place between the dielectric material of the dielectric film 22 and silicon atoms in the polysilicon used in the upper silicon layers 27. It is therefore possible to make the dielectric film 22 keep an excellent insulating capability without being degraded by the chemical reaction which would otherwise take place. It is furthermore possible to make the dielectric film 22 of tantalum oxide or a like dielectric material of a high relative permittivity and thereby to make the semiconductor device have a small size, a high package density, and a large capacitance. Even with the lower concentration of impurity in the upper silicon layers 27, indirect contact of the dielectric film 22 and the upper silicon layers 27 makes it possible to avoid occurrence of the reversal which would otherwise take place at an interface contiguous to the dielectric film 22 in the upper silicon layers 27. This renders it possible to use the lower concentration of impurity in the upper silicon layers 27.

Reviewing FIGS. 2 through 6, it is now readily understood that a dynamic random access memory or a static random access memory of a large capacity, such as a dynamic random access memory of 64 or 124 megabits, can be manufactured according to the method illustrated with reference to FIGS. 2 to 4, FIGS. 5 (A) to (H), or FIGS. 6 (A) to (H). The barrier metal films 48 can be used in the semiconductor devices described in connection with FIGS. 2 to 4 and FIGS. 5 (A) to (H). The n-type impurity or impurities can be changed to at least one p-type impurity provided that the semiconductor substrate 16 is either doped with an n-type impurity or provided that the semiconductor substrate 16 is a p-type semiconductor substrate comprising an n-type well.

Figure 7:
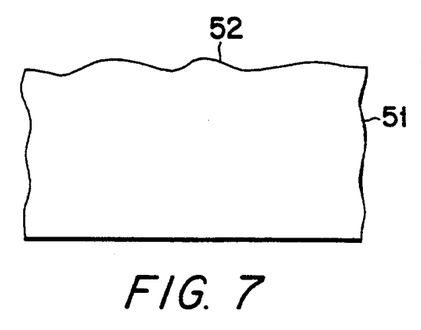
FIG. 7 is a schematic vertical sectional view of an underlying silicon layer for use in a semiconductor device according to a fourth embodiment of this invention.

Referring now to FIG. 7, an underlying substrate 51 is for use in a semiconductor device according to a fourth embodiment of this invention in providing the silicon substrate 16 described in conjunction with FIGS. 2 to 6. It has been found that the underlying substrate 51 has a micro-rough surface 52 having a micro-roughness. More particularly, the micro-rough surface 52 has undulations or convex and concave portions of the order of 10 Å.

Figure 8:
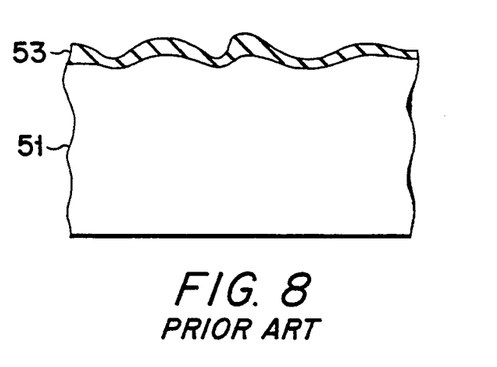
FIG. 8 is a schematic vertical sectional view of another conventional semiconductor device.

Turning to FIG. 8, it will be assumed that the underlying substrate 51 is subjected to local oxidization so as to form a silicon dioxide film 53 on the micro-rough surface 52. The silicon dioxide film 53 is either the insulator film 17 used in the semiconductor device described in conjunction with FIGS. 2 to 6 or a gate oxide film used in a metal-oxide-semiconductor field effect transistor (MOS FET). In such a semiconductor device, the silicon dioxide film 53 is preferably as thin as 100 Å and should have an excellent insulating capability and a high reliability. It has been confirmed that the silicon dioxide film 53 is thick on the convex portions of the micro-rough surface 52 and is thin on the concave portions of the surface 52 and that the micro-roughness is exaggerated. This adversely affects the insulating capability and the reliability.

Figure 9A:
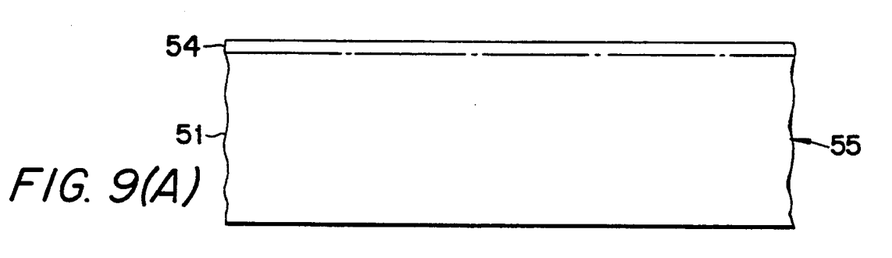

Referring to FIG. 9 (A), a silicon single crystal film 54 is grown on the underlying substrate 51 when the underlying substrate 51 is made of silicon. When the single crystal film 54 is grown to a film thickness between 50 and 1000 Å, a silicon substrate 55 is obtained to have a highly smooth surface having undulations of the order of only 10 Å, namely, a high smoothness of the order of a silicon monoatomic film. An interface between the underlying substrate 51 and the single crystal film 54 is depicted by a dash-dot line which shows the fact that the underlying substrate 51 and the single crystal film 54 are rendered integral into the silicon substrate 55.

On growing the silicon single crystal film 54, the underlying substrate 51 is placed in a reaction furnace which may be either a quartz tube or a bell jar. Introducing a gas mixture of hydrogen and a silane gas, such as monosilane or dichlorosilane, into the reaction furnace, the silicon single crystal film 54 is epitaxially grown on the underlying substrate 51 at a temperature between 800° and 1100° C. The gas mixture may have either the atmospheric pressure or a reduced pressure. It is believed that the convex and the concave portions of the micro-rough surface 52 (FIG. 7) serve as nuclei and kinks of the epitaxial growth to grow the silicon single crystal film 54 on the concave portions with a higher priority. It is possible to make the silicon substrate 55 have a likewise smooth surface when the silicon single crystal film 54 is deposited on the underlying substrate 51 by chemical vapor deposition.

Figure 9B:
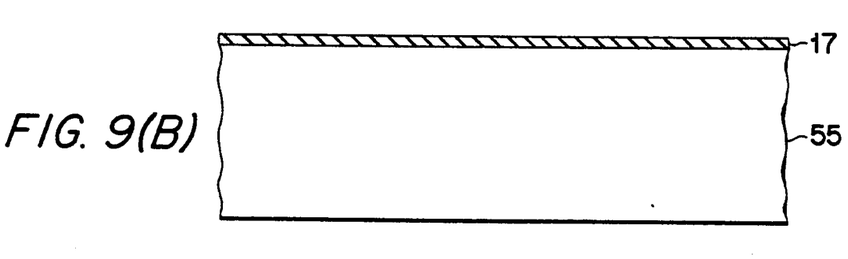
Figure 10A:
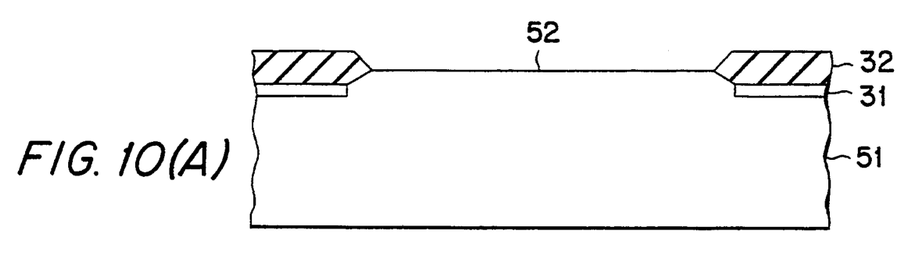
Figure 10B:
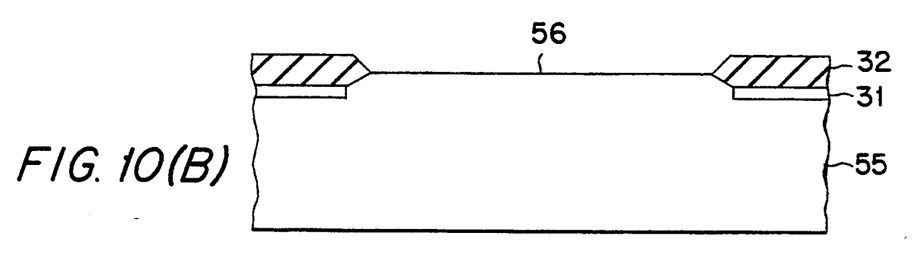
Figure 10C:
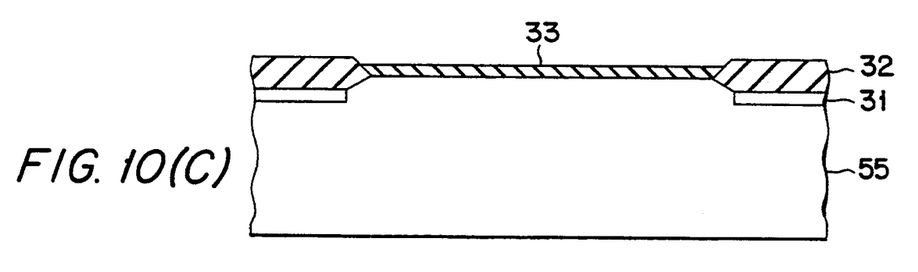
Figure 10D:
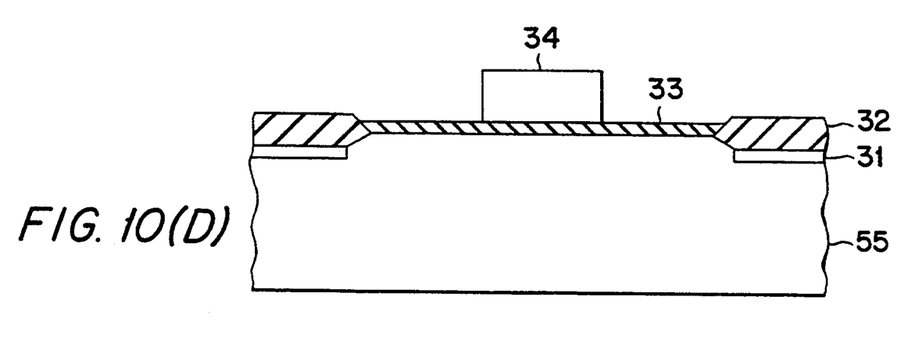
Figure 10E:
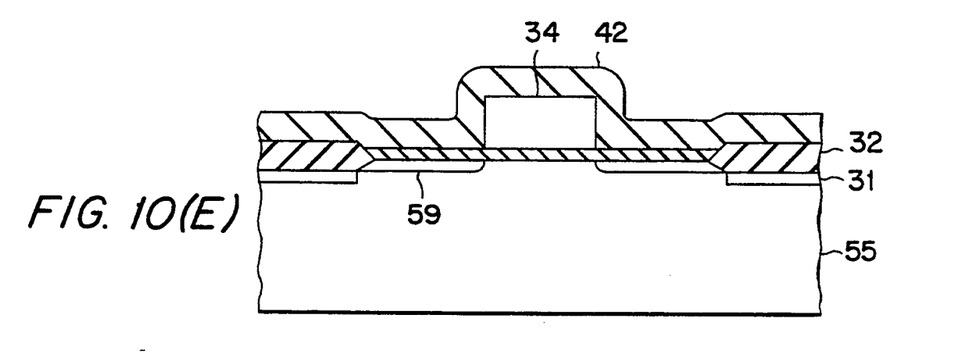
Figure 10F:
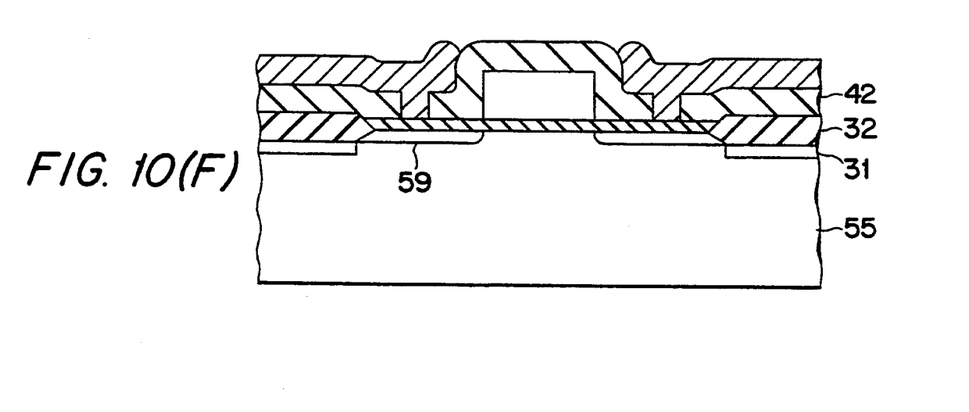

Turning to FIG. 9 (B), an insulator film is formed on the highly smooth surface (FIG. 9 (A)) of the silicon substrate 55 by local oxdation of silicon (LOCOS) at and adjacent to the highly smooth surface. It has been confirmed that an interface between the insulator film 17 and the silicon substrate 55 is as smooth as the highly smooth surface and that the insulator film 17 has an excellent insulating capability and a high reliability even when the insulator film 17 is 100 Å or less thick.

Referring to FIGS. 10 (A) through (F), the description will proceed to a semiconductor device according to a fifth embodiment of this invention. The semiconductor device comprises a plurality of metal-oxide-semiconductor field effect transistors. Similar parts are designated by like reference numerals. The semiconductor device is manufactured as follows to comprise one of the metal-oxide-semiconductor field effect transistors.

In FIG. 10 (A), an underlying substrate 51 is made of p-type doped silicon and has a micro-rough surface 52. Channel stopper regions 31 are heavily doped with a p-type impurity on the micro-rough surface 52. Field oxide films 32 are selectively formed on the channel stopper regions 31 for separation of elementary parts of the field effect transistor. It should be noted that the micro-rough surface 52 is depicted merely for convenience of illustration as if it were a smooth surface.

In FIG. 10 (B), selective epitaxial growth of p-type doped silicon single crystal film (not shown herein) is carried out on the micro-rough surface 52 (FIG. 10 (A)) with hydrogen chloride added to the above-exemplified silane gas. A p-type silicon substrate 55 is thereby obtained to have a highly smooth surface 56 between stacks, each consisting of the channel stopper region 31 and the field oxide film 32. Inclusion of hydrogen chloride prevents the single crystal film from growing on the field oxide films 32.

In FIG. 10 (C), a gate oxide film 33 is formed on the silicon substrate 55 by thermal oxidization to a film thickness between 80 and 100 Å. It has been confirmed that an interface is as smooth as the highly smooth surface 56 (FIG. 10 (B)) between the gate oxide film 33 and the silicon substrate 55 and that the gate oxide film 33 has an excellent insulating capability and a high reliability.

In FIG. 10 (D), a gate electrode 34 is formed on the gate oxide film 33. In the gate electrode 34, polysilicon is doped with phosphorus, The gate oxide film 33 has a wider exposed film area around the gate electrode 34.

In FIG. 10 (E), the field oxide film 32 and the gate electrode 34 are used collectively as a mask on ion implanting arsenic into the silicon substrate 55. Heat treatment or annealing is subsequently carried out to form heavily n-type doped source and drain regions 59 below the gate oxide film 33. Thereafter, an interlayer insulator layer 42 is formed of either phosphor-silicate glass (PSG) borophosphor-silicate glass (BPSC) on the field oxide film 32, on the wider exposed film area of the gate oxide film 33, and on the gate electrode 74.

In FIG. 10 (F), openings are selectively formed through the interlayer insulator layer 42 to reach the gate oxide film 33. Metal wirings 43 are formed on the interlayer insulator layer 42 in a predetermined pattern of reaching the gate oxide film 33.

Reviewing FIGS. 10 (A) through (F), it should be understood that the silicon single crystal film is doped with an impurity which is usually of a conductivity type given to the underlying substrate 51. Similar merits are, however, achieved even when the silicon single crystal film is doped with an impurity having a different conductivity type relative to the conductivity type of the underlying substrate 51. The field oxide films 32 have an appreciable step size above the highly smooth surface 56 when formed by selective local oxidation of silicon. It is possible to reduce the step size when the field oxide films 32 are formed by selective epitaxial growth.

Figure 11:
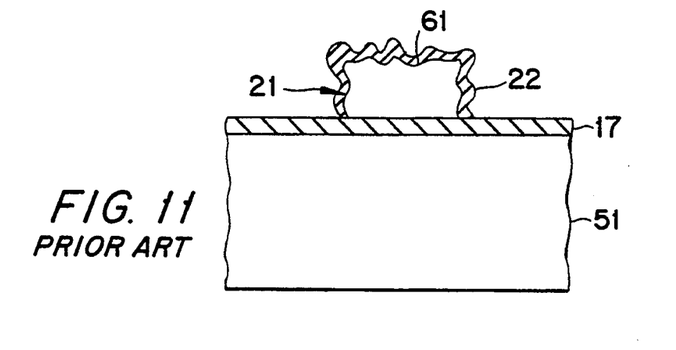
FIG. 11 is a schematic vertical sectional view of still another conventional semiconductor device.

Turning to FIG. 11, a conventional semiconductor device comprises a charge storage capacitor cell like the semiconductor device described in conjunction with FIGS. 2 to 4, FIGS. 5 (A) to (H), or FIGS. 6 (A) to (H). Similar parts are designated by like reference numerals.

The semiconductor device comprises an underlying substrate 51 of silicon, an insulator film 17 of silicon dioxide on the underlying substrate 51, and a patterned electrode 21 which is made of polysilicon on the insulator film 17 as one of a pair of opposing electrodes of the capacitor cell, has electrode side and top surfaces, and leaves an exposed insulator area around the patterned electrode 21. A dielectric film 22 covers the electrode side and top surfaces and the exposed insulator area of the insulator film 17.

The electrode side and top surfaces have an appreciable roughness to make an interface between the electrode side and top surfaces and the dielectric film 22 have undulations of about 1000 Å or more. It has been confirmed that this roughness results from rough side and top surfaces of the patterned electrode 21 and that this adversely affects the insulating capability and the reliability of the dielectric film 22 particularly when the dielectric film 22 is as thin as about 50 Å.

Figure 12A:
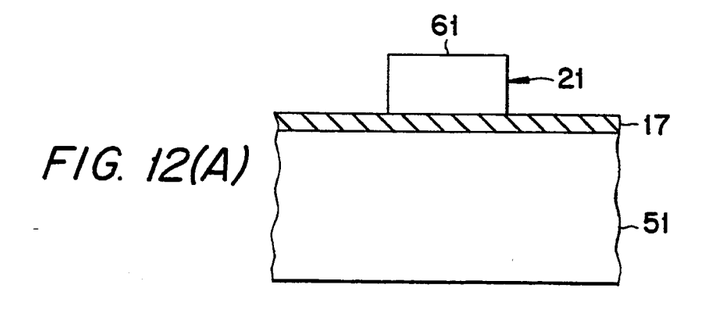
Figure 12B:
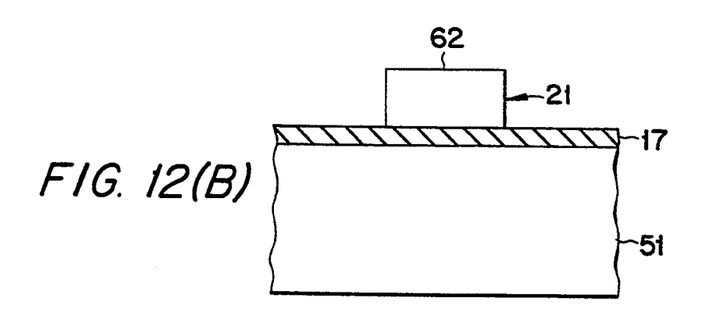
Figure 12C:
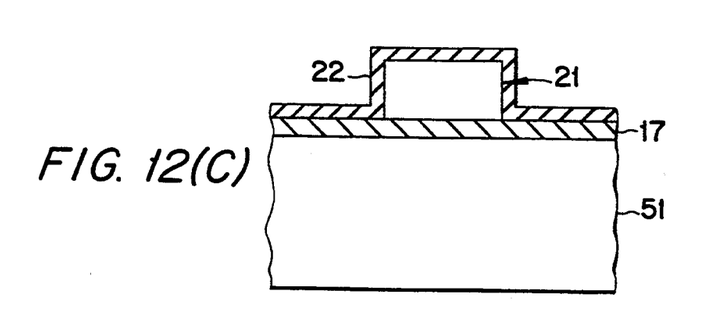

Referring to FIGS. 12 (A) through (C), there is illustrated a semiconductor device according to a sixth embodiment of this invention. Similar parts are designated by like reference numerals. The semiconductor device serves as a dynamic random access memory and is manufactured as follows.

In FIG. 12 (A), an underlying substrate 51 of silicon is selectively oxidized along its surface into an insulator film 17 of silicon dioxide. The patterned electrode 21 is formed on the insulator film 17 by chemical vapor deposition of polysilicon and the subsequent patterning according to selective etching. The patterned electrode 21 has the above-mentioned rough side and top surfaces indicated at 61. The rough side and top surfaces 61 have undulations of the order of 1000 Å. It should be noted that the rough side and top surfaces are depicted merely for convenience of illustration as if they are smooth surfaces.

In FIG. 12 (B), the patterned electrode 21 is made to have smooth side and top surfaces 62. For this purpose, an assembly of the underlying substrate 51, the insulator film 17, and the patterned electrode 21 is placed in a reaction furnace, such as a quartz tube or a bell jar. Introducing a gas mixture of monosilane and hydrogen chloride into the reaction furnace, the assembly is treated at a temperature between 450° and 650° C. An amorphous silicon film is grown to a film thickness between 100 and 5000 Å selectively on the rough side and top surfaces. This selective growth is possible because the gas mixture includes hydrogen chloride to prevent the amorphous silicon film from growing on the exposed insulator area of the insulator film 17. It should be understood that the amorphous silicon film is illustrated by solid lines which are used to primarily indicate the smooth side and top surfaces 62 of the patterned electrode 21.

In FIG. 12 (C), a dielectric film 22 is formed on the smooth side and top surfaces of the patterned electrode 21 and on the exposed insulator area either by chemical vapor deposition of silicon nitride or by thermal oxidation of the smooth side and top surfaces into silicon dioxide. It has been confirmed that the interface between the smooth side and top surfaces and the dielectric film 22 is smooth enough to have undulations less than 100 Å and that the dielectric film 22 has an excellent insulating capability and a high reliability even when the dielectric film 22 is made of silicon nitride to have a thin film thickness of 50 Å.

Referring again to FIGS. 5 (A) through (C) and (E) through (H), the description will proceed finally to a semiconductor device according to a seventh embodiment of this invention. The semiconductor device is a dynamic random access memory which is similar to the semiconductor device illustrated with reference to FIG. 11 and comprises one transistor and one charge storage capacitor cell. Consideration should not be given therefore to one of the capacitor cells that is only partly depicted in FIGS. 5 (E) to (H) to the left of the capacitor cell illustrated in full.

On describing a method of manufacturing the semiconductor device in the following, the reference numeral "16" will be used to denote an underlying substrate which is designated by the reference numeral "51" above. The lower and the upper silicon layers 26 and 27 will collectively be referred to as a patterned electrode 21.

In FIG. 5 (A), a channel stopper region 31 is formed on the underlying substrate 16 of p-type silicon. A field oxide film 32 is selectively formed on the channel stopper region 31 for use in separating elementary parts of the dynamic random access memory.

In FIG. 5 (B), gate oxide films 33 are selectively formed on the underlying substrate 16. On the field oxide film 32 and on the gate oxide films 33, gate electrodes 34 are selectively formed to leave a wider exposed substrate area on the underlying substrate 16 around the gate electrodes 34. By using the field oxide film 32 and the gate electrodes 34 collectively as a mask, ion implantation is carried out and followed by heat treatment to form n-type doped shallow source and drain regions 35. Spacer layers 37 are formed of silicon dioxide on the gate electrodes 34 to leave a narrower exposed substrate area around the spacer layers 37.

In FIG. 5 (C), the spacer layers 37 are used collectively as a mask for ion implantation, which is followed by heat treatment. Heavily doped n-type deep source and drain regions 38 are thereby formed. As a result of this heat treatment, the underlying substrate 16 is oxidized at the narrower exposed substrate area into silicon dioxide to form a continuous spacer 39 including the spacer layers 37.

In FIG. 5 (E), an opening or hole is selectively formed through the continuous spacer 39 to reach one of the deep source and drain regions 38. A patterned electrode 21 (designated by the reference numerals 26 and 27 as noted above) is formed to fill the opening, lie on partial areas of the continuous spacer 39, and leave a wider insulator area on the continuous spacer 39 around the patterned electrode 21. It should be noted that the patterned electrode 21 has rough side and top surfaces 61 which are depicted in FIGS. 11 and 12 (A) and has undulations of the order of 1000 Å.

An amorphous silicon film is selectively grown on the rough side and top surfaces 61. The patterned electrode 21 is thereby made to have smooth side and top surfaces 62 described in connection with FIG. 12 (B). It should again be understood that the amorphous silicon film is shown by the solid lines which are primarily representative of the smooth side and top surfaces 62.

In FIG. 5 (F), a dielectric film 22 is formed only on the smooth side and top surfaces 62 (FIG. 12 (B)) of the patterned electrode 21. In the manner described before, the dielectric film 22 is formed either by chemical vapor deposition of silicon nitride, silicon dioxide, or a combination of silicon nitride and silicon dioxide or deposition of a metal oxide, such as tantalum oxide. It has been confirmed that the dielectric film 22 is given an excellent insulating capability and a high reliability by the smooth side and top surfaces of the patterned electrode 21.

In FIG. 5 (G), a covering or counter electrode 23 is formed on the dielectric film 22. A narrower exposed insulator area is left on the continuous spacer 39 around the covering electrode 23.

In FIG. 5 (H), an interlayer insulator layer 42 is formed on the covering electrode 23, on the narrower exposed insulator area, and on a transistor which is herein depicted as the gate electrode 34 with the spacer layer 37 to the left of the capacitor cell being illustrated. An opening is selectively formed through the interlayer insulator layer 42 to reach the other of the deep source and drain regions 38. Metal wirings 43 are formed on the interlayer insulator layer 42 in a predetermined pattern of reaching the other of the deep source and drain regions 38.

Reviewing FIGS. 12 (A) to (C), it should be noted that each patterned electrode 21 is preferably composed of the lower and the upper silicon layers 26 and 27 in the manner described in conjunction with FIGS. 2 to 4, FIGS. 5 (A) to (H) for the first time, FIGS. 5 (A) to (C) and (E) to (H) later, or FIGS. 6 (A) to (H). Under the circumstances, the amorphous silicon film should be grown selectively on rough side and top electrode surfaces of each upper silicon layer 27. When such a patterned electrode 21 is given smooth side and top electrode surfaces, the charge storage capacitor cells have a high reliability. A barrier metal film is more preferably formed between the patterned electrode 21 and the dielectric film 22 of each capacitor cell.

While this invention has so far been described in specific conjunction with several preferred embodiments thereof with reference to FIGS. 2 to 4, FIGS. 5 (A) to (H) first, FIGS. 5 (A) to (C) and (E) to (H) again, FIGS. 6 (A) to (H), FIGS. 7 and 9 (A) and (B), FIGS. 10 (A) to (F), and FIGS. 12 (A) to (C), it will now be readily possible for one skilled in the art to put this invention into effect in various other manners. For example, the silicon single crystal film 54 may be formed on the underlying substrate 51 in addition to the amorphous silicon film in the examples illustrated with reference to FIGS. 12 (A) to (C) and later FIGS. 5 (A) to (C) and (E) to (H).

What is claimed is:

1. A semiconductor device, comprising: a semiconductor substrate having a substrate surface, an insulator film on said substrate surface, and a charge storage capacitor which comprises a patterned electrode patterned on said insulator film and having electrode side surfaces and an electrode top surface, a dielectric film on said electrode side surfaces and said electrode top surface, and a covering electrode on said dielectric film and in which said patterned electrode is composed of a lower silicon layer patterned on said insulator film and having layer side surfaces and a layer top surface and an upper silicon layer having said electrode side surfaces and said electrode top surface and being in electric contact with said lower silicon layer at said layer side surfaces and said layer top surface, wherein said upper silicon layer is in direct contact with said dielectric film at said electrode side surfaces and said electrode top surface and wherein said lower silicon layer is doped with a first impurity to a concentration between $10^{15}$ and $10^{18}$ atoms per cubic centimeter, and said upper silicon layer is doped with a second impurity to a concentration between $10^{18}$ and $10^{20}$ atoms per cubic centimeter.

2. A semiconductor device as claimed in claim 1, further comprising a barrier metal film between said electrode side surfaces and said electrode top surface and said dielectric film.

* * * * *